(12) United States Patent
Knecht et al.

(10) Patent No.: US 7,541,883 B2
(45) Date of Patent: Jun. 2, 2009

(54) COAXIAL RESONATOR BASED VOLTAGE CONTROLLED OSCILLATOR/PHASED LOCKED LOOP SYNTHESIZER MODULE

(75) Inventors: Thomas A. Knecht, Dundee, IL (US); Robert Jacobson, Orland Park, IL (US); Glen Reeser, Palatine, IL (US)

(73) Assignee: CTS Corporation, Elkhart, IN (US)

( * ) Notice: Subject to any disclaimer, the term of this patent is extended or adjusted under 35 U.S.C. 154(b) by 16 days.

(21) Appl. No.: 11/598,491

(22) Filed: Nov. 13, 2006

(65) Prior Publication Data

US 2007/0126521 A1 Jun. 7, 2007

Related U.S. Application Data

(60) Provisional application No. 60/737,543, filed on Nov. 17, 2005.

(51) Int. Cl.
*H03B 5/18* (2006.01)
*H03L 7/099* (2006.01)

(52) U.S. Cl. .............................. 331/101; 331/25; 331/68

(58) Field of Classification Search .................. 331/25, 331/68, 69, 96, 101, 102, 187
See application file for complete search history.

(56) References Cited

U.S. PATENT DOCUMENTS

| 4,571,558 | A | 2/1986 | Gay et al. |
| 5,604,468 | A | 2/1997 | Gillig |
| 5,959,503 | A | 9/1999 | Knecht et al. |
| 5,990,752 | A | 11/1999 | Papazian et al. |
| 6,114,918 | A * | 9/2000 | Gris et al. ...................... 331/96 |
| 6,593,819 | B2 | 7/2003 | Lazarescu |
| 6,661,295 | B2 | 12/2003 | Knecht et al. |
| 6,675,471 | B1 * | 1/2004 | Kimura et al. ................. 29/846 |
| 6,700,448 | B1 | 3/2004 | Knecht |
| 6,946,919 | B2 | 9/2005 | Knecht et al. |

FOREIGN PATENT DOCUMENTS

| JP | 09 191206 | 7/1997 |
| JP | 11 163526 | 6/1999 |

* cited by examiner

*Primary Examiner*—David Mis
(74) *Attorney, Agent, or Firm*—Daniel J. Deneufbourg

(57) ABSTRACT

A synthesizer module/oscillator assembly includes a voltage controlled oscillator with a coaxial resonator. In one embodiment, the module measures 20.3 mm×14.8 mm×3.9 mm and the coaxial resonator is positioned on the circuit board of the module between a phase locked loop integrated circuit and a main section of the voltage controlled oscillator. The phase locked loop circuit includes a loop filter and is adapted to receive the frequency signal generated by the voltage controlled oscillator and generate an adjusted frequency signal.

15 Claims, 4 Drawing Sheets

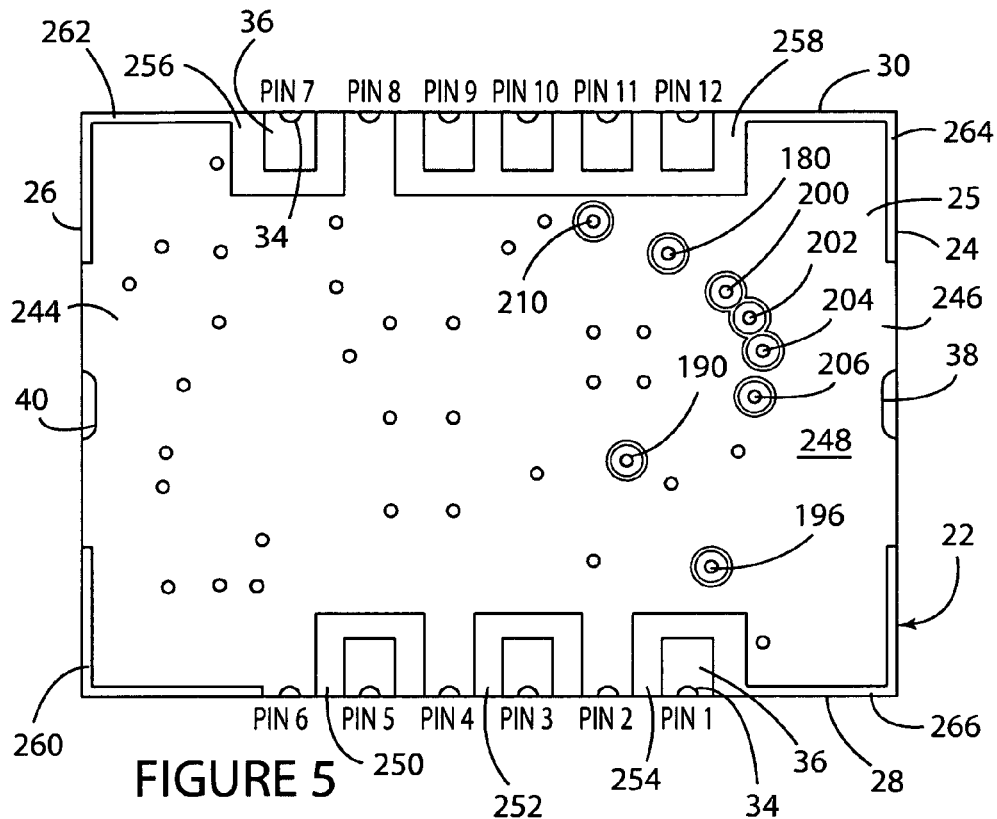
FIGURE 5
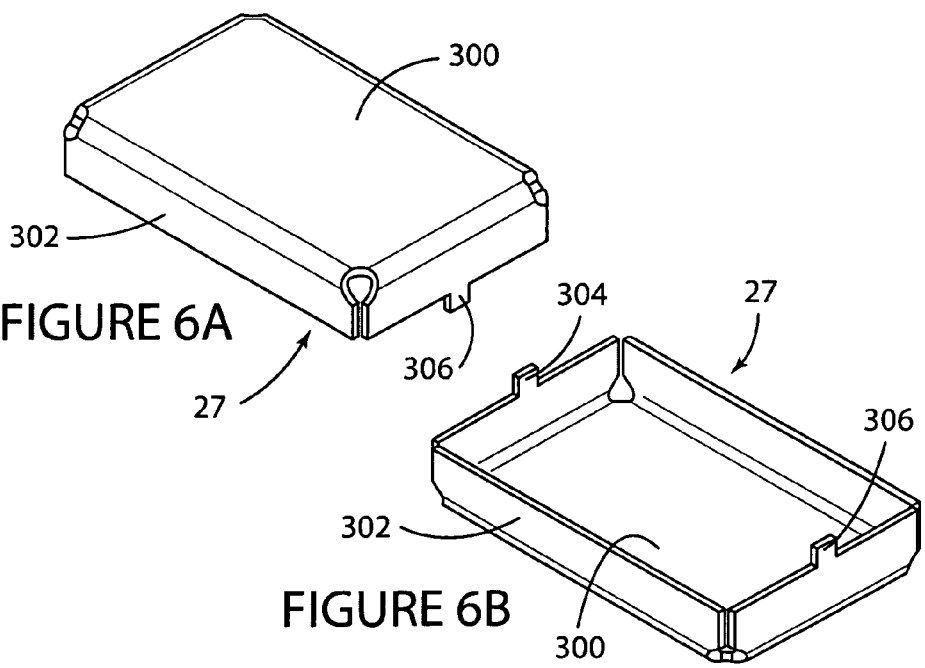
FIGURE 6A
FIGURE 6B

COAXIAL RESONATOR BASED VOLTAGE CONTROLLED OSCILLATOR/PHASED LOCKED LOOP SYNTHESIZER MODULE

CROSS-REFERENCE TO RELATED APPLICATION

This application claims the benefit of the filing date and disclosure of U.S. Provisional Application Ser. No. 60/737,543, filed on Nov. 17, 2005 which is explicitly incorporated herein by reference as are all references cited therein.

FIELD OF THE INVENTION

This invention relates to a voltage controlled oscillator/phase locked loop (VCO/PLL) module and, more particularly, to a reduced-size VCO/PLL synthesizer module adapted for use in connection with, for example, infrastructure base stations and microwave "point to point" and "point to multipoint" systems.

BACKGROUND OF THE INVENTION

Coaxial resonator (CR) based low phase noise synthesizer packages available today for use in connection with, for example, wireless infrastructure base stations are composed of a plurality of discrete components adapted to be assembled onto a customer's motherboard.

A disadvantage, of course, associated with these discrete component based synthesizer packages is that they require substantially more space on a customer's printed circuit board than the space occupied on a customer's circuit board by a typical 20.3 mm×14.8 mm infrastructure oscillator module.

The present invention solves this problem by providing a CR-based VCO/PLL module adapted to occupy the same 20.3 mm×14.8 mm footprint.

SUMMARY OF THE INVENTION

This invention is directed to a reduced-size coaxial resonator-based voltage controlled oscillator/phase locked loop synthesizer device or module which preferably measures about 20.3 mm×14.8 mm×3.9 mm and comprises a voltage controlled oscillator which is adapted to generate a frequency signal, a coaxial resonator which is in communication with the voltage controlled oscillator for generating the frequency signal, and a phase locked loop circuit which is in communication with the voltage controlled oscillator and is adapted to receive the frequency signal and generate an adjusted frequency signal.

In one embodiment, the phase locked loop circuit includes a loop filter and a buffer circuit is in communication with the voltage controlled oscillator. The voltage controlled oscillator, coaxial resonator and phase locked loop circuit may be mounted on, and electrically connected to, a substrate or printed circuit board to define and complete the module. A lid may also be used to engage and cover the circuit board.

There are other advantages and features that will be more readily apparent from the following description of the invention, the drawings, and the appended exemplary claims.

BRIEF DESCRIPTION OF THE DRAWINGS

In the accompanying drawings that form part of the specification, and in which like numerals are employed to designate like parts throughout the same:

FIG. 5 is an enlarged top plan view of the back side of the printed circuit board of the CR-based VCO/PLL module of the present invention; and FIGS. 6A and 6B are enlarged perspective views of the top and interior respectively of the lid of the module of the present invention.

DETAILED DESCRIPTION OF THE PREFERRED EMBODIMENT

While this invention is susceptible to embodiments in many different forms, this specification and the accompanying drawings disclose only one preferred embodiment as an example of the present invention. The invention is not intended, however, to be limited to the embodiment so described.

In the figures, a single block or cell may indicate several individual components and/or circuits that collectively perform a single function. Likewise, a single line may represent several individual signals or energy transmission paths for performing a particular operation.

Figure 1:
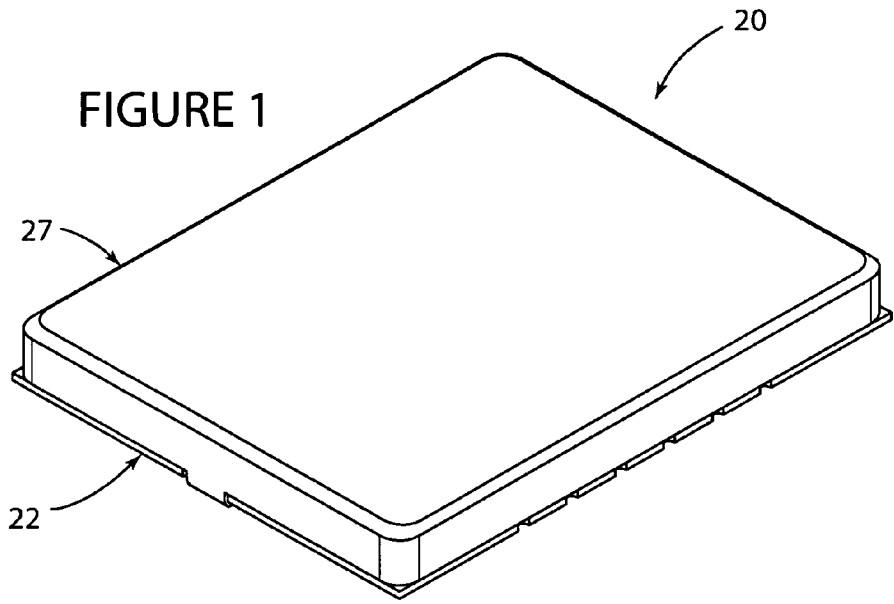
FIG. 1 is a top plan perspective view of a CR-based VCO/PLL module in accordance with the present invention.
Figure 2:
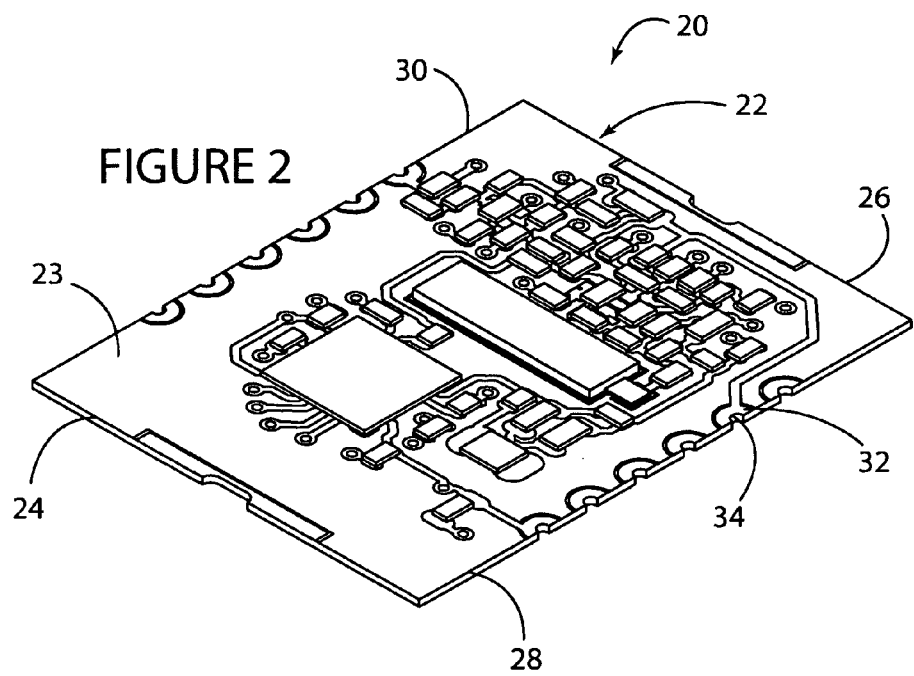
FIG. 2 is a top plan perspective view of the circuit board of the module shown in FIG. 1.

FIGS. 1 and 2 depict the reduced-size coaxial resonator (CR) based VCO/PLL (Voltage Controlled Oscillator/Phase Lock Loop) synthesizer module 20 of the present invention and adapted for use in, for example, wireless infrastructure base stations and microwave "point to point" and "point to multipoint" systems operating at frequencies between about 1 GHz and 5 GHz.

The module 20, which has a size of 20.3 mm (L)×14.8 mm (W)×3.9 mm (H) (maximum), includes a generally rectangular-shaped printed circuit board 22 on which all of the electrical and electronic components are appropriately positioned together with a metal lid or shield 27 adapted to cover all of the components.

Printed circuit board 22 (FIGS. 2, 4 and 5) includes respective front and back faces 23 and 25, opposed short side edges 24 and 26, and opposed long side edges 28 and 30. A first plurality of direct surface mount pinout pads 1-6 are positioned along the periphery of the edge 28 of the board 22 in spaced-apart and parallel relationship between the edges 24 and 26. A second plurality of direct surface mount pinout pads 7-12, which are diametrically opposed to pinouts 1-6, are positioned along the periphery of the opposed side edge 30 of the board 22 in spaced-apart and parallel relationship between the edge 24 and the edge 26.

Pinouts 1-12 are adapted to provide the following identified circuit functions:

1) VCC (PLL & VCO)
2) GND
3) REF Input
4) GND
5) N/C
6) GND
7) RF Output
8) GND
9) Lock Detect
10) Clock
11) Data
12) Load Enable Pinouts 1-12 of module 20 are characterized in that each is 1.0 mm wide and 2.0 mm apart from each other when measured from center to center. On the front face 23 of board 22, pinouts 1-12 are defined by a plurality of semi-circular strips of conductive material 32 (FIG. 2 and 4) extending along the periphery of edges 28 and 30 in spaced-apart and parallel relationship. The strips 32 surround respective grooves or castellations 34 (FIGS. 2 and 5) which have been formed in the respective edges 28 and 30 and extend between the front and back faces 23 and 25 of the board 22.

On the back face 25 of board 22, pinouts 1-12 are defined by a plurality of generally rectangular-shaped strips of conductive material 36 (FIG. 5) which are opposed from the strips 32 and extend along the periphery of edges 28 and 30 in spaced-apart and parallel relationship and surround the respective grooves or castellations 34. Although not shown in any of the drawings, it is understood that the exterior surface of each of the castellations 34 is covered with a layer of conductive material for electrically connecting the respective top and bottom pinout strips 32 and 36.

Figure 4:
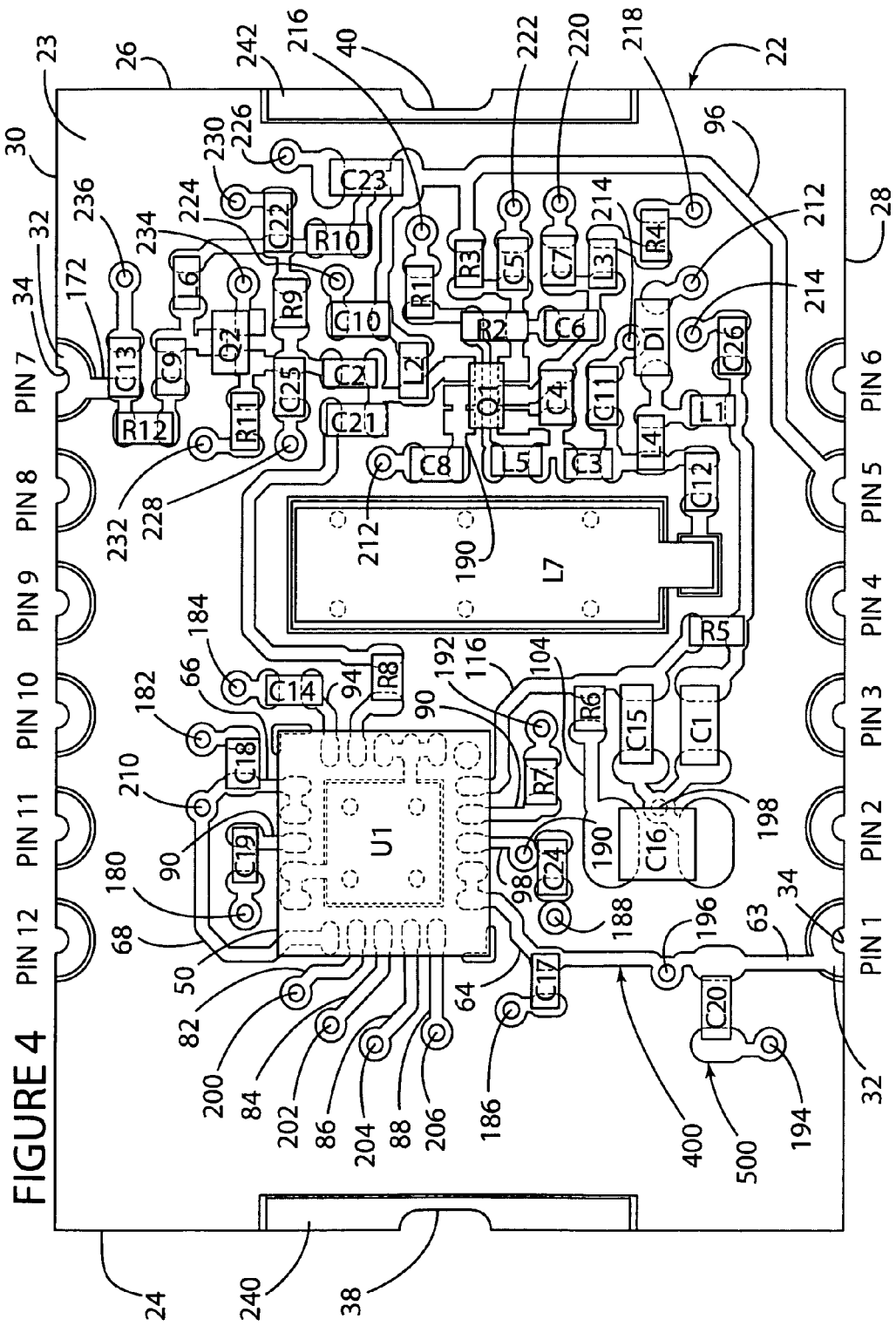
FIG. 4 is an enlarged top plan view depicting the component layout on the front side of the printed circuit board of the CR-based VCO/PLL module of the present invention.

The board 22 additionally defines a pair of centrally located, diametrically opposed, generally semi-oval-shaped grooves or castellations 38 and 40 (FIGS. 4 and 5) which are defined in the respective board edges 24 and 26 and extend between the front and back faces 23 and 25 of board 22. The outer surface of each of the grooves 38 and 40 is also adapted to be covered with a layer of conductive material and the grooves 38 and 40 are adapted to receive the tabs 304 and 306 (FIGS. 6A and 6B) of the metal lid or shield 27 (FIGS. 1, 6A and 6B) which is adapted to be fitted and secured over the top of the board 22. As shown in FIGS. 4 and 5, the grooves 38 are surrounded, on the front face 23 of board 22, by rectangular-shaped strips of conductive material 240 and 242 and, on the back face 25 of board 22, by strips of conductive material 244 and 246. As a result, grooves 38 and 40 provide an electrical grounded contact path between the strips 240 and 242 and the strips 244 and 246 respectively.

Figure 3:
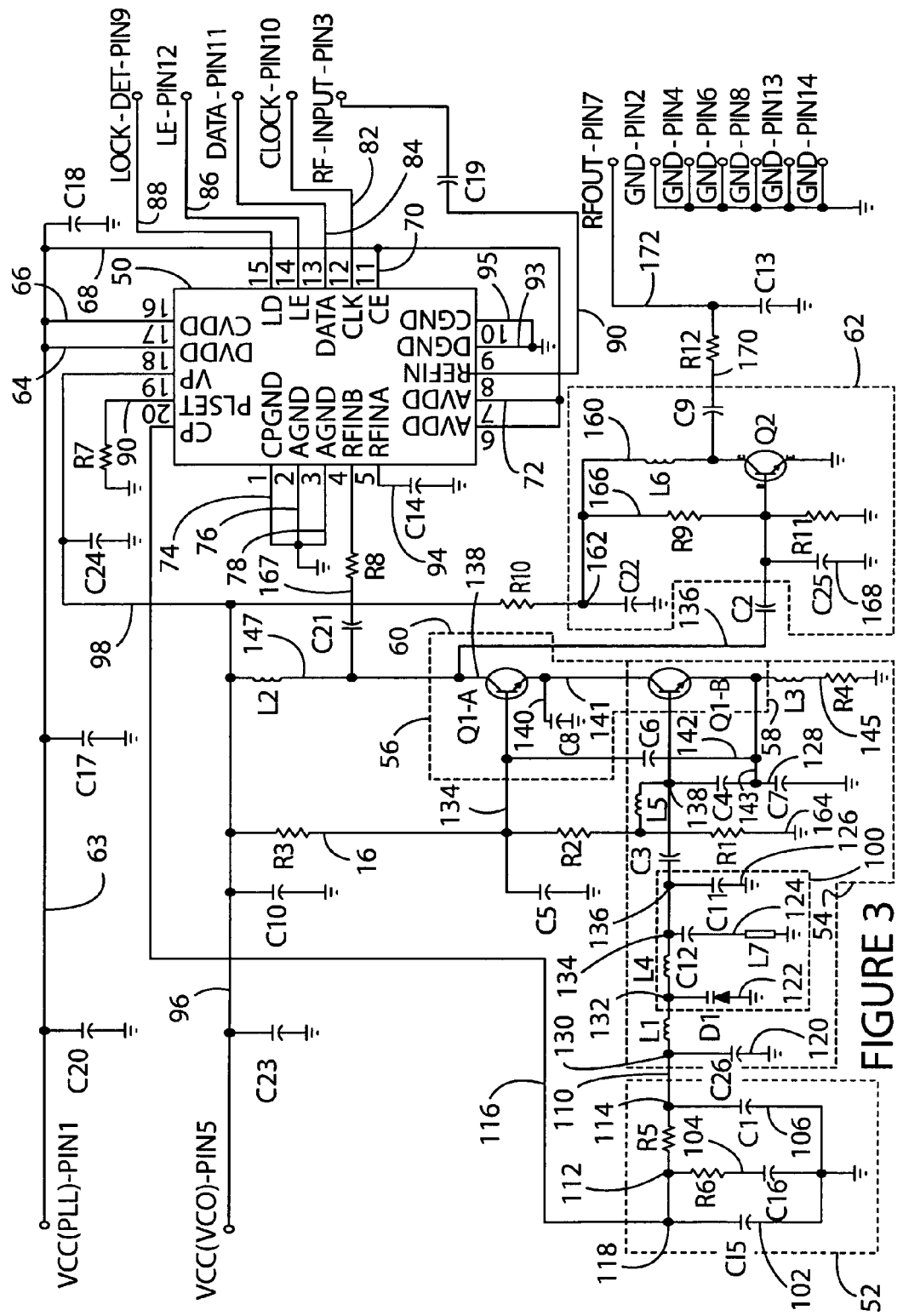
FIG. 3 is a schematic diagram of the electrical circuit of the CR-based VCO/PLL module of FIG. 1.

FIG. 3 is a detailed schematic diagram of the electrical circuit of the VCO/PLL module 20 of the present invention. The circuit of course comprises a plurality of electrical components including capacitors (C), resistors (R), inductors (L), varactors (D), transistors (Q), and integrated circuits (U) which have been arranged and interconnected as shown in detail in FIG. 3.

The circuit defines, among other circuits and sections, a PLL IC section or circuit 50 located in the upper right-hand corner of the circuit, a loop filter section or circuit 52 located in the lower left-hand corner of the circuit, a voltage controlled oscillator such as a Colpitts oscillator section or circuit 54 immediately to the right and interconnected to the loop filter section 52, a cascoded transistor section or circuit 56 including an oscillator stage 58 and a buffer stage 60, and an additional output buffer stage 62 immediately to the right of the Colpitts oscillator section 54 and below the PLL IC section 50. CR L7 is part of the Colpitts oscillator section 54. Coaxial resonator L7 is commercially available from Transtech Corporation. The coaxial resonator has a high Q factor thus resulting in an oscillator with low phase noise. It is understood, of course, that the dotted lines in FIG. 3 define only the boundaries of the main sections or portions of each of the circuit sections defined above.

During the operation of module 20, voltage controlled oscillator 54 generates a frequency signal. Coaxial resonator L7 along with varactor D1, capacitor C12, and capacitor L4 defines the frequency signal. The phase locked loop circuit 50 is in communication with the voltage-controlled oscillator 54. The phase locked loop circuit can include a phase detector and a charge pump. The phase locked loop circuit 50 can receive the frequency signal and generate an adjusted frequency signal in order to keep the frequency and phase of the signal at the desired value. Output buffer stage 62 reduces the effects of external loading on the operation of the VCO/PLL circuit.

Stated another way, voltage controlled oscillator generates a periodic output signal which is a multiple of the reference frequency. Then, if the phase from the voltage controlled oscillator falls behind that of the reference signal, the phase detector causes the charge pump to change the control voltage which, in turn, causes an increase in the speed of the voltage controlled oscillator.

If the phase creeps ahead of the reference signal, the phase detector causes the charge pump to change the control voltage to slow down the voltage controlled oscillator. The loop filter 52 smoothes out the control signal from the phase lock loop circuit prior to application to the voltage controlled oscillator.

C20, C18, and C17 are all bypass capacitors on the PLL supply line 63 coupled to VCC (PLL) Pin 1. Each of the capacitors C20, C18, and C17 is located between the PLL supply line and ground. Circuit lines 64, 66, and 68 extend between the PLL supply line 63 and the DVDD Pin 17, CVDD Pin 16, and AVDD Pin 6 respectively of the PLL IC 50. PLL IC 50 is commercially available from Analog Devices in Norwood, MA. Still further, respective circuit lines 70 and 72 extend between the circuit line 68 and the CE Pin 11 and the AVDD Pin 7 of PLL IC 50. The CPGND Pin 1, AGND Pin 2 and AGND Pin 3 of PLL IC 50 are connected via respective circuit lines 74, 76, and 78 to a common circuit line which is coupled to ground. The PLSET Pin 19 of PLL IC 50 is connected to ground through a circuit line 90 including a resistor R7.

The CLK Pin 12, DATA Pin 13, LE Pin 14 and LD Pin 15 of PLL IC 50 are connected through respective circuit lines 82, 84, 86, and 88 to the Clock-Pin 10, Data-Pin 11, LE-Pin 12, and Lock-Det-Pin 9 of module 20 respectively. A circuit line 90 with a resistor C19 thereon interconnects the REF IN Pin 8 of PLL IC 50 to the RF-Input Pin 3 of module 20. A circuit line 94 with capacitor C14 connects the RFINA Pin 5 of PLL IC 50 to ground. The DGND Pin 9 and CGND Pin 10 of PLL IC 50 are coupled to ground through circuit lines 93 and 95 respectively.

C23, C10 and C22 are all bypass capacitors on the VCO supply circuit line 96 extending between VCC (VCO) Pin 5 of module 20 and circuit line 98, which extends between the VP Pin 18 of PLL IC 50 and ground. C24, R10, and C22 are located on circuit line 98 between the PLL IC 50 and ground. C24 is located between the PLL IC 50 and circuit line 96, while R10 and C22 are located between the circuit line 96 and ground. Each of the capacitors C23, C10, and C22 is positioned between the VCO supply line and ground.

Pins 10, 11 and 12 of module 20 define the digital input lines for the customer to program the PLL IC 50 to the desired output frequency. Pin 9 of module 20 is the lock detect pin that indicates whether the PLL IC 50 is in lock or not. Pin 3 of module 20 is the reference input frequency line to the PLL IC 50. It is capacitively coupled with C19 to the PLL IC 50.

The loop filter section 52 is comprised of C15, R6, C16, R5 and C1. The resonator tank circuit 100 is part of the voltage controlled oscillator circuit 54 and comprises D1, L4, C11, C12 and L7. C3 is a coupling capacitor located between the tank circuit 100 and the oscillator gain stage of oscillator circuit 54. C4 and C7 are the feedback capacitors in the oscillator loop or circuit 54. L3 and R4 are also part of oscillator circuit 54 and connect the emitter of Q1-B to ground.

Loop filter section 52 comprises three circuit lines 102, 104, and 106 positioned in spaced-apart and parallel relationship and connected to ground through a common circuit line 108. C15 is located on circuit line 102. R6 and C16 are located on circuit line 104 and C1 is located on circuit line 106. R5 is located on circuit line 110 which interconnects the loop filter section 52 to the base of transistor Q1-B. Circuit lines 104 and 106 connect to circuit line 110 at respective nodes 112 and 114. R5 is located between nodes 112 and 114. Another circuit line 116 connects the loop filter section 52 to the CP Pin (20) of PLL IC 50 at node 118.

C26, D1, C12, L7, C11, C4, and C7 are all elements located on respective circuit lines 120, 122, 124, 126, and 128 extending in parallel relationship between the loop filter portion 52 of the circuit and the base of transistor Q1-B. Circuit lines 120, 122, 124, 126, and 128 connect to circuit line 110 at respective nodes 130, 132, 134, 136, 138, and 139. The other end of each of the circuit lines 120, 122, 124, 126, and 128 is coupled to ground. L1 is located on circuit line 110 between nodes 130 and 132. L4 is located on circuit line 110 between nodes 132 and 134. C3 is located on circuit line 110 between nodes 136 and 138. Both C4 and C7 are located on circuit line 128.

L7 on circuit line 124 defines the CR, i.e., the primary inductive element in the tank circuit 100. L7 is series connected at one end to the parallel connection of varactor D1 on circuit line 122 and capacitors C11 and C12 on respective circuit lines 124 and 126. The other end of L7 is coupled to ground.

Although not described herein in any detail, it is understood that a CR (coaxial resonator) is a conductor which has been embedded in a ceramic block. The longer the CR, the lower the resonant frequency. For example, a 1120 MHz resonator is 5.64 mm long and approximately 0.080 inches (2.03 mm) square in cross-section, while a 2240 MHz resonator is 2.82 mm long with the same cross-section.

C5 is located on a circuit line 134 which couples the base of transistor Q1-A to ground. Q1-A is commercially available from NEC. L1 is an inductor in series between the loop filter circuit 52 and the tank circuit 100 which suppresses unwanted AC signals on the DC line.

C2 is a coupling capacitor located on a circuit line 136 extending between the first buffer stage 60 and the second buffer stage 62. More specifically, circuit line 136 extends between the base of transistor Q2 and a circuit line 138 extending between the collector of transistor Q1-A and the circuit line 136. Buffer stage 62 comprises C22, R9, L6, R11, C25, Q2 and C9. Buffer stage 60 comprises Q1-A, C8 and Q1-B. Q1-B is also commercially available from NEC. C2, along with C25, also act as voltage dividers between the first buffer stage 60 and the second buffer stage 62. C8 is part of oscillator stage 58 and comprises a bypass capacitor located on a circuit line 140 extending between the collector of Q1-B and the emitter of transistor Q1-A.

C6 is located on a circuit line 142 extending between circuit lines 134 and 143. Circuit line 143 extends between circuit line 128 and circuit line 145 which connects the emitter of Q1-B to ground. L3 and R4 are located on circuit line 145 between the emitter of Q1-B and ground. C6, via circuit lines 142, 143, and 145, couples the emitter of Q1-B and the base of Q1-A.

L2 is an inductor on circuit line 138 extending between the collector of Q1-A and circuit line 96 that allows the DC voltage from Pin 5 of module 20 to supply power to the transistors Q1-A and Q1-B and not allow AC signal to pass. L6 on circuit line 160 performs the same function for the second buffer stage transistor Q2. Circuit line 160 extends between the collector of Q2 and circuit line 98. Circuit line 160 connects to circuit line 98 at node 162 which is located between R10 and C22 on circuit line 98.

The output of the first buffer stage 60 is also coupled back to the PLL IC 50 through C21 and R8 on a circuit line 167 extending between the circuit line 141 and the RFINB Pin 4 of PLL IC 50.

R1, R2 and R3, on circuit line 165 extending between ground and the circuit line 96, define the resistors that bias the buffer transistor Q1-A and the oscillator transistor Q1-B. Transistors Q1-A and Q1-B are both housed in the same package to save space. R9 and R11, on circuit line 166 extending between ground and circuit line 160, are the bias resistors for the second buffer stage 62. R10, on circuit line 98 extending between ground and the VP Pin 18 of PLL IC 50, is a resistor which drops the voltage to the second buffer stage 62. C25 is located on a circuit line 168 extending between circuit line 136 and ground.

C9, R12, and C13 are the output termination elements that form an output-matching network. C9 and R12 are located on a circuit line 170 extending between the circuit line 160 and a circuit line 172 which extends between ground and the RF-OUT Pin 7 of the module 20. C13 is located on circuit line 172 between the circuit line 170 and ground. Module pins 2, 4, 6, 8, 13 and 14 are all ground pins.

The operative specifications for the module 20 are detailed in Table 1 below:

TABLE 1

| | Min. | Typ. | Max. | Units |
|---|---|---|---|---|
| Frequency | 1000.56 | | 1010.37 | MHz |
| Supply voltage | 4.75 | 5.00 | 5.25 | VDC |
| Current drain | | | 70 | mA |
| Lock time (all modes) | | | 300 | msec |
| Operating temperature range | −40 | | 85 | ° C. |
| Phase noise @ 1 MHz offset | | | −147 | dBc/Hz |

The structure, layout, and location of each of the elements on the printed circuit board 22 of the VCO/PLL module 20 of the present invention is shown in FIGS. 4 and 5, i.e., FIG. 4 depicting the front or top face 23 of the board 22 and FIG. 5 depicting the back or bottom face 25 of the board 22.

Front face 23 has both a plurality of conductive wiring traces 400 formed thereon and a plurality of mounting sites 500 formed thereon for mounting the plurality of electrical components including capacitors, resistors, inductors, terminators, varactors, and integrated circuits as described in more detail below. Although not shown, it is understood that the printed circuit board 22 is a GETEK™ board made of a plurality of conventional electrically insulative laminates (four are preferable for this design).

The selection, location, arrangement, placement, and interconnection between each of the particular individual components as shown in FIG. 4 of course is the novelty which allows for the creation of the CR-based VCO/PLL module in accordance with the present invention. A brief description of the location, placement and arrangement of each of the components shown in FIG. 4 follows, although the same is fully disclosed and shown in detail in FIG. 4 in a manner which would allow one of ordinary skill in the art to reduce this invention to practice.

Generally speaking, and with reference to the board orientation depicted in FIG. 4, it is noted that the PLL IC 50 is located on the one-half of the board 22 adjacent the board edge 24; that the VCO main section is located on the opposite half of the board 22 adjacent the board edge 26; and that the CR L7 is located on the board 22 between the PLL IC 50 and the VCO main section. The loop filter section 52 is located below the PLL IC 50 and between the CR L7 and board edge 24. The output buffer stage 62 is located above the VCO main section and between the CR L7 and the edge 26. Q1 and Q2 are located between the CR L7 and the board edge 26. D1 is located on the board 22 between the CR L7 and the board edge 26.

With this CR, for example, a 1000.56-1010.37 MHz VCO/PLL module has a typical phase noise of −149 dBc/Hz at 1.0 MHz, i.e., an 8 dB improvement over currently available standard synthesizer systems. The Q of CR L7 is about 200 as opposed to a standard wirewound inductor which has a Q of about 35.

Referring back to FIG. 4, it is noted that C19 is located between the IC 50 and the edge 30 of the board 22 and extends in a direction generally parallel to the board edge 30. One end of C19 is coupled to a non-grounded via 180, while the other end of C19 is coupled to the PLL IC 50 through a conductive trace defining the circuit line 90.

All of the conductive traces, of course, define respective circuit lines and thus, the terms "conductive traces" and "circuit lines" are used herein interchangeably. Moreover, and although not described in each instance where an element is coupled to either a grounded or non-grounded via, it is understood that a respective conductive trace or circuit line couples the respective element to either the grounded or non-grounded via.

C18 is located to the right of and spaced apart from, C19 and also extends in an orientation generally parallel to the board edge 30. One end of C18 is coupled to a ground via 182, while the other end of C18 is connected to the PLL IC 50 through circuit line 66. The end of C18 which is coupled to the PLL IC 50 is coupled to another input of IC 50 through circuit line 68. Non-grounded via 210 is located on circuit line 68. C14 is located between the IC 50 and CR L7 and extends in an orientation generally parallel to both the IC 50 and CR L7. One end of C14 is coupled to a ground via 184 and the other end is connected to PLL IC 50 through circuit line 94.

C17, C24, R7, C20, C16, R6, C15, and C1 are located between the IC 50 and the board edge 28 on the left side of the CR L7, i.e., between the CR L7 and board edge 24. C17 extends in an orientation generally parallel to the edge 28 and parallel to the lower edge of IC 50. One end of C17 is coupled to a ground via 186. The other end of C17 is coupled to IC 50 through circuit line 64. C24 is spaced from and extends to the right of C17, while R7 extends to the right of C24. One end of C24 is coupled to a ground via 188. The other end of C24 is coupled to the IC 50 through circuit line 98. A non-grounded via 190 is located on circuit line 98 between C24 and IC 50. In a similar manner, one end of R7 is coupled to a ground via 192, while the other end is coupled to the IC 50 through circuit line 90.

C20 is located in the lower left-hand corner of the board 22 in a relationship generally spaced apart from and parallel to the board edge 28. One end of C20 is coupled to a ground via 194 and the other end of C20 is coupled to Pin 1 of module 20 through circuit line 63. Circuit line 63 also couples the other end of C20 to the end of C17 which is not coupled to via 186. A non-grounded via 196 couples to circuit line 63 between C17 and C20.

C16 is located to the right of, above, and in a spaced and parallel relationship to, C20 and generally below C24. C16 is positioned in an orientation generally parallel to board edge 24. One end of C16 is coupled to a ground via 198, while the other end is coupled to one end of R6 through circuit line 104.

R6, C15 and C1 are all located to the right of C16 and generally below R7 and on the left side of L7. R6, C15 and C1 extend in a spaced-apart relationship generally normal to C16. One end of C15 is coupled to the ground via 198, while the other end of C15 is coupled to one end of R5 through circuit line 110. One end of C1 is coupled to ground via 198, while a conductive trace couples the other end to R5. One end of R6 is coupled to C16 via circuit line 104, while the other end of R6 is coupled to the IC 50 through circuit line 116. Ground via 198 is located between C16 and C15. R5 is located to the right of C15 and C1 and below and between the CR L7 and board edge 28 and extends in a generally normal relationship relative to C15 and C1.

A conductive trace couples one end of R5 to one end of C15. The other end of R5 is coupled to C1 through a respective conductive trace and to L1 through respective conductive traces. Circuit lines 82, 84, 86, and 88 extend between respective non-grounded vias 200, 202, 204, and 206 located in the space on the board 22 between the board edge 24 and the IC 50.

R8 is located between the IC 50 and CR L7 in an orientation generally parallel to the edge of board 30. A conductive trace couples one end of R8 to the IC 50. The other end of R8 is connected to one end of C21 through a conductive trace which wraps around the top of CR L7. C21 is located on the right side of CR L7.

A description of the location, orientation and interrelationship between the elements comprising the VCO follows. The VCO initially comprises C8, L5, and C3 which are all located to the right of CR L7 and extend generally between the mid-portion of the CR and the bottom edge thereof. C8, L5 and C3 are all co-linearly aligned and oriented in a relationship parallel to the right side edge of CR L7 and the board edge 22.

L4 is located generally below C3 and to the right of and above C12 which is located adjacent the bottom edge of L7. L4 is oriented in a relationship generally parallel to the bottom board edge 28 and in a generally normal relationship relative to C3 and L7.

C21 and C2 are located above and to the right of C8, above Q1-A, and in orientation generally parallel to C8 and L7. L2 is located below C21 and C2 and the right of C8 and extends in an orientation generally normal to C21, C2 and C8. Q1-A is located below L2 and to the right of C8 and L5 and is oriented in a relationship generally parallel to L2 and normal to C8 and L5.

C4 and C11 are located below Q1-A, to the right of L5 and C3, and are positioned in an orientation generally normal to L5 and C3.

L1 is located below L4 to the right of C12 and is positioned in an orientation generally normal to both L4 and C12.

C26 is located to the right of L1 and is positioned in an orientation generally normal thereto. D1 is located above C26 and to the right of L4 and is positioned in an orientation generally parallel to C26 and L4. C6 is located above D1 and to the right of C4 and C11 and is positioned in an orientation generally normal to D1, C4 and C11. R2 is located above C6 and to the right of Q1-A and is positioned in a co-linear relationship with C6.

R3, C5, C7, and L3 are located to the right of R2 and C6 and are positioned in an orientation generally normal thereto. R4 is located below L3 and to the right of D1 and is positioned in a relationship generally parallel to L3 and D1.

R1 is located above R3 and to the right of L2 and is positioned in an orientation generally parallel to R3 and L2. C10 is located above R1 and to the right of C10 and is positioned in an orientation generally normal to R1 and parallel to C2.

The interconnection between the various elements of the VCO will now be described. One end of C8 is coupled to a ground via 212 while the other end thereof is coupled to the emitter of Q1-A through circuit line 140. A conductive trace couples one end of L5 to one end of R2, while the other end of L5 is coupled to one end of C3 and one end of C4 through respective conductive traces. The other end of C3 is coupled to one end of L4 and one end of C11 through respective conductive traces. A conductive trace couples one end of L4 to one end of C12. Another conductive trace couples the other end of C12 to the lower end of L9.

A conductive trace couples one end of L1 to one end of L4. L4 is connected to L1 and also to one end of D1 through a respective conductive trace. C26 has one end connected to an end of C1 through a respective conductive trace and an opposite end connected to a ground via 214.

One end of D1 is coupled to a ground via 212. The other end of D1 is coupled to L4 through a respective conductive trace. One end of C11 is coupled to a ground via 214, while the other end is coupled to one of the ends of C3 through a respective circuit line.

C4 has one end coupled to both the ends of L5 and C3 and Q1-A through respective conductive traces, while the other end thereof is coupled to Q1-A through a respective conductive trace.

L2 has one end coupled to Q1-A through a respective conductive trace, while the opposite end thereof is coupled to one of the ends of C10 through a respective conductive trace.

R1 has one end coupled to one of the ends of R2, while the other end of R1 is coupled to a ground via 216. The other end of R2 is coupled to Q1-A, C6 and C5 via respective conductive traces.

The other end of C6 is coupled to the end of C4 and one of the ends of both L3 and C7.

R4 has one end coupled to a ground via 218 and an opposite end connected to one end of L3. The other end of L5 is coupled to the ends both of C6 and C7. The other end of C7 is coupled to a ground via 220.

C5 has one end coupled to a ground via 222. The other end of C5 is coupled to one of the ends of R2 and to one of the ends of R3. The other end of R3 is coupled to a conductive trace which, in turn, is coupled to circuit line 96 which, in turn, is coupled to Pin 5 of module 20.

Board 22 still further comprises elements C21, C2, C10, R10 and C23 located in the right hand corner of the board 22 between the VCO and the board edge 30 and also between CR L7 and the board edge 26.

One end of C21 is coupled to Q1-A. The other end of C21 is coupled to one of the ends of R8, located on the other side of CR L7, through a conductive trace which wraps around the top of CR L7. C2 also has one end coupled to Q1-A and an opposed end coupled to one end of R11.

C10 has one end coupled to a ground via 224 and an opposite end coupled to both C23 and L2 through respective conductive traces.

R10 has one end coupled to one end of C23 and an opposite end coupled to L6.

C23 has one end coupled to circuit line 96 and one end of R10, while the other end of C23 is coupled to a ground via 226.

Board 22 still further comprises elements C25, R9, C22, R11, Q2, C9, and L6 which in combination comprise the buffer stage 62 of module 20. These elements are located in the right hand corner of the board 22 generally between the edge 30 of board 22 and the elements C21, C2, C10, R10, and C23.

C25 is located above C21 and C2 and to the right of the top edge of CR L7 and is positioned in an orientation generally normal to the orientation of C21, C2, and the CR L7. R9 is located to the right of C25 and above C10 and in an orientation generally normal to C10 and co-linear with C25. C22 is located above R10 and to the right of and above R9 and is positioned in an orientation generally normal to R10.

R11 and Q2 are located in a generally side-by-side and parallel relationship above and relative to C25 and R9. C9 is located above Q2 and L6 is located generally between and to the right of Q2 and C9.

C25 has one end coupled to a ground via 228. The other end of C25 is coupled to one end of R9 through a conductive trace. The other end of R9 is coupled to one end of C22 through a conductive trace. The other end of C22 is coupled to a ground via 230. R11 has one end coupled to a ground via 232 and an opposite end coupled to Q2 through a conductive trace. Q2 is coupled to C25, ground via 234, C9, and L6 through respective conductive traces.

L6 has one end connected to C22 and an opposite end coupled to both Q2 and C9 through respective conductive traces.

C13 is located between C9 and the board edge 30 and is oriented in a relationship generally parallel to both the board edge 30 and C9. R12 is located to the left of both C9 and C13 and positioned in a relationship generally normal to C9 and C13. R12 has one end coupled to one end of C9 and an opposite end coupled to one end of C13. C13, in turn, has one end (the end coupled to R12) coupled to Pin 7 of module 20 by way of conductive trace 172 and an opposite end coupled to a ground via 236.

FIG. 4 also depicts respective generally rectangular-shaped strips 240 and 242 surrounding the respective castellations/grooves 38 defined in opposed board edges 24 and 26. The strips 240 and 242 are in electrical contact with respective rectangular-shaped strips 244 and 246 (FIG. 5) on the back side 25 of board 22 which surround the back side ends of the respective castellations 38.

As also shown in FIG. 5, the back side 25 of board 22 includes a ground layer of conductive material 248 which covers a majority of the surface except for generally U-shaped respective board regions 250, 252, 254, 256, and 258 surrounding the pads 36 defining Pins 1, 3, 5, 7, and 9-12 of module 20; respective edge regions 260, 262, 264, and 266 extending around the corners of the board 22 respectively; and circular regions surrounding each of the non-grounded vias. The regions 262, 264, and 266 extend into the regions 256, 258, and 254 respectively. The strips 244 and 246 and respective pads 36 define portions of the layer 248.

FIG. 5 additionally depicts the plurality of grounded vias terminating in the ground layer 248 together with the plurality of non-grounded vias also terminating in the ground layer 248.

Module 20 additionally comprises an outer metal shield/lid 27 (FIGS. 1, 6A, and 6B) which is adapted to be fitted over the front face 23 of the board 22. Lid 27 includes a roof 300 and peripheral sidewalls 302 extending generally normally downwardly therefrom. Tabs 304 and 306 depend downwardly from the lower longitudinal peripheral edge of two of the opposed sidewalls 302 and are adapted to be respectively fitted into the grooves 38 defined in each of the respective board edges 24 and 26.

Although not shown in any of the FIGURES, it is understood that the VCC/PLL module 20 of the present invention is processed in a 2.6"×4.5" "24 UP" array which allows for the manufacture and processing of a total of twenty-four VCO/PLL modules in accordance with the present invention.

The process of fabricating module 20 in accordance with the present invention is briefly described below. Initially, silver/tin solder or the like is screen printed and applied to the front face of the board 22 in a manner so as to define the printed wiring pattern or traces, pinouts 1-12 and conductive strips shown in FIG. 4. Silver/tin solder is also applied to the outer surfaces of each of the grooves 34 and 38 for electrically connecting the respective pads 32 and 36 with each other and the respective strips 240 and 242 and 244 and 246 with each other.

Once the solder has been appropriately applied to all of the desired areas of the board and castellations/grooves, all of the electrical components are picked from a tape and reel (as known in the art) and subsequently placed onto the board 22 and, more particularly, positioned over each of the component sites as depicted and described in FIG. 4.

Lid 27 is then picked from a tape and reel and subsequently positioned and secured over the board 22 in a manner as shown in FIG. 1 wherein the lower peripheral edges of the walls 302 are seated over the respective conductive strips 240 and 242 and the tabs 304 and 306 thereof are fitted into the respective board grooves 28. The lid 27, of course, is grounded by virtue of its being placed into contact with the conductive strips 240 and 242 which are in contact with the ground layer 248 via castellations 38.

The solder is then reflowed, as is known in the art, so as to secure each of the components to the board 22. In accordance with the present invention, the solder surrounding the board castellations 38, when reflowed, flows into the respective castellations and into sealing contact with the respective lid tabs fitted therein so as to seal and secure the outer lid 27 to the board 22.

Numerous variations and modifications of the embodiment described above may be effected without departing from the spirit and scope of the novel features of the invention. No limitations with respect to the specific module illustrated herein are intended or should be inferred.

We claim:

1. A wireless infrastructure oscillator module comprising a circuit board approximately 14.8 mm in width and 20.3 mm in length and including an integrated circuit, a loop filter and a voltage controlled oscillator with a coaxial resonator.

2. The module of claim 1 wherein the coaxial resonator is located between the integrated circuit and a main section of the voltage controlled oscillator.

3. The module of claim 2 wherein a first set of pads are located along one edge of the circuit board in spaced-apart relationship, and a second set of pads are located along a diametrically opposed edge of the circuit board in spaced-apart relationship.

4. The module of claim 1 further comprising a lid adapted to cover the circuit board.

5. The module of claim 4 further comprising a pair of grooves defined in opposing edges of the circuit board, the lid including a pair of tabs adapted to be fitted within said grooves respectively for locating and securing the lid on the circuit board.

6. The module of claim 1 having a maximum height of approximately 3.9 mm.

7. A module comprising a circuit board approximately 14.8 mm in width and 20.3 mm in length and including a phase locked loop integrated circuit, a loop filter, and a voltage controlled oscillator with a coaxial resonator located on the printed circuit board between the phase locked loon integrated circuit and the voltage controlled oscillator.

8. The module of claim 7 wherein a first set of pads are located along one edge of the circuit board in spaced-apart relationship, and a second set of pads are located along a diametrically opposed edge of the circuit board in spaced-apart relationship.

9. The module of claim 7 further comprising a lid adapted to cover the circuit board.

10. The module of claim 9 further comprising a pair of grooves defined in opposing edges of the circuit board, the lid including a pair of tabs adapted to be fitted within said grooves respectively for locating and securing the lid on the circuit board.

11. The module of claim 7 having a maximum height of approximately 3.9 mm.

12. An oscillator assembly comprising:
a circuit board approximately 14.8 mm in width and 20.3 mm in length;
a voltage controlled oscillator mounted to the circuit board;
a coaxial resonator mounted to the circuit board; and
a phase locked loop circuit mounted to the circuit board;
the circuit board electrically connecting the voltage controlled oscillator, the coaxial resonator, and the phase locked loop circuit.

13. The assembly of claim 12 further comprising a lid adapted to engage and cover the circuit board.

14. The assembly of claim 12 further comprising a loop filter mounted to the circuit board.

15. The assembly of claim 12 further comprising a buffer circuit mounted to the circuit board.

* * * * *